United States Patent [19]

Engel et al.

[11] Patent Number: 4,896,105
[45] Date of Patent: Jan. 23, 1990

[54] AC ELECTRIC ENERGY METER HAVING DRIVE CIRCUIT INCLUDING STEPPER MOTOR FOR DRIVING MECHANICAL REGISTER

[75] Inventors: Joseph C. Engel, Monroeville Boro; Robert T. Elms, Monroeville, both of Pa.

[73] Assignee: Westinghouse Electric Corp., Pittsburgh, Pa.

[21] Appl. No.: 173,499

[22] Filed: Mar. 25, 1988

[51] Int. Cl.$^4$ .................................. G01R 11/16
[52] U.S. Cl. .................................. 324/142; 318/696; 324/117 R; 340/870.02
[58] Field of Search ........ 318/345 CB, 345 D, 345 H, 318/490, 696, 809, 701, 685; 324/142, 117 R; 340/870.02; 379/107

[56] References Cited

U.S. PATENT DOCUMENTS

| | | | |
|---|---|---|---|
| 2,765,433 | 10/1956 | Lilienstein | 318/696 |
| 4,034,292 | 7/1977 | McClelland, III | 340/870.02 |
| 4,182,983 | 1/1980 | Heinrich et al. | |
| 4,359,684 | 11/1982 | Ley | 324/142 |
| 4,413,230 | 11/1983 | Miller | |
| 4,465,959 | 8/1984 | Yajima | 318/696 |
| 4,531,051 | 7/1985 | Sagmuller | |
| 4,594,620 | 6/1986 | Shoji et al. | 318/696 |
| 4,603,287 | 7/1986 | Setoya | 318/696 |
| 4,633,156 | 12/1986 | Besson et al. | 318/696 |

Primary Examiner—Reinhard J. Eisenzopf
Assistant Examiner—W. Burns
Attorney, Agent, or Firm—B. R. Studebaker

[57] ABSTRACT

An AC electric energy meter is coupled to a source of AC electrical energy and to an AC load. A sensing circuit senses the amount of AC electric energy consumed by the AC electric load. An AC electric energy measuring circuit generates a pulse signal representative of the amount of AC electric energy consumed by the AC electric load. A switching circuit receives the pulse signal from the AC electrical energy measuring circuit and controls current flow from the AC electrical energy source to a stepper motor to drive an output shaft of the stepper motor in a unidirectional manner based on the pulse signal. A register is coupled to the output shaft of the stepper motor for registering the amount of electrical energy consumed by the AC electric load based on the amount of rotation of the output shaft of the stepper motor. The stepper motor includes a core having an air gap, a rotatable permanent magnet positioned in the air gap and a winding wound about the core, for generating a magnetic field across the air gap. The switching circuit controls the direction of current flow through the winding to alternately reverse the polarity of the magnetic field across the air gap, so that the permanent magnet rotates in a unidirectional manner.

27 Claims, 5 Drawing Sheets

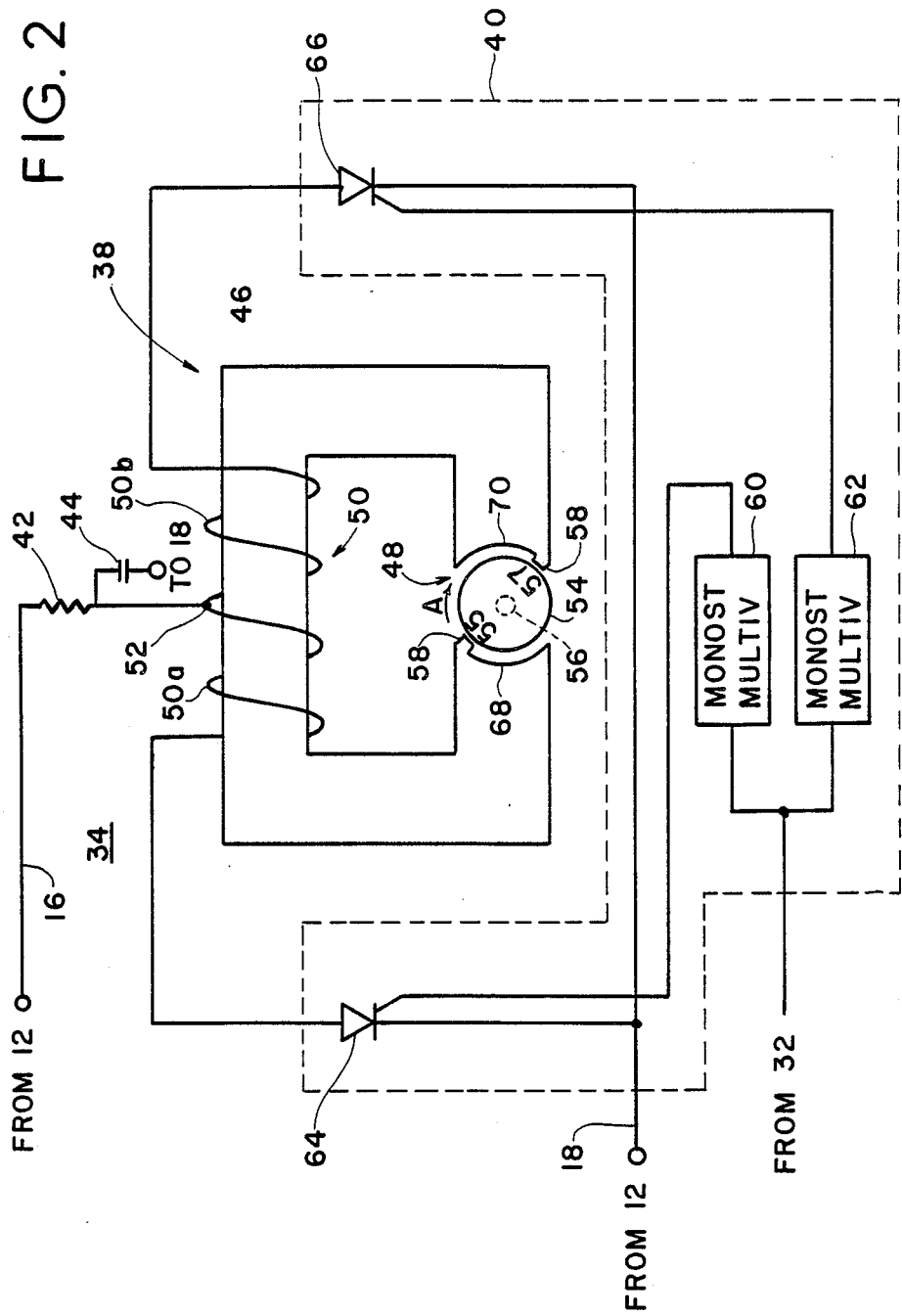

(PRIOR ART)

AC ELECTRIC ENERGY METER HAVING DRIVE CIRCUIT INCLUDING STEPPER MOTOR FOR DRIVING MECHANICAL REGISTER

BACKGROUND OF THE INVENTION

Field of the Invention

This invention relates to AC electric energy meters and more particularly to an AC electric energy meter capable of driving a mechanical register based on a pulse signal output by an electronic AC electrical energy measuring circuit.

Devices for AC electric energy measurement are extensively used by producers of electric energy for measuring consumption by individual energy users. Typically, such meters are watthour meters which are used for indicating energy consumption in kilowatthours. Many watthour meters which are currently in use, are induction type watthour meters which have a rotating disk and which provide a high degree of reliability and accuracy. Further, these induction type watthour meters are available at reasonable cost and are capable of outdoor operation under widely varying extremes of temperature and other ambient conditions.

Recently, electronic AC electrical energy measuring circuits, or solid state watt meter circuits, have been developed, which do not employ a rotating disk but which instead produce a pulse signal, wherein each output pulse of the pulse signal is equivalent to a single rotation of the disk in a conventional induction type watthour meter. This type of electronic watt meter is described in U.S. Pat. No. 4,182,983 to Heinrich et al., assigned to the assignee of the subject application. These electronic watt meters are more accurate and tamper-resistant than the above-described rotating disk arrangement. However, with the electronic watt meter, it is necessary to count the pulses and to store the pulses in a non-volatile manner since the incremental count of the pulses over a period of time is proportional to the amount of energy consumed. While the pulses can be counted, stored and displayed in a totally electronic manner, costs and durability considerations have led to a desire to employ a mechanical register of the type which is currently used in conventional induction type watthour meters. Further, in view of the fact that watthour meters are not replaced for many years, the use of a mechanical register for both induction type watthour meters and electronic watthour meters has a number of advantages in that a uniform display is provided, which can be easily and accurately read for billing purposes.

While the need for an AC electric energy meter which combines an electronic AC electrical energy measuring circuit and a mechanical register exists, thus far there has not been an economical and accurate solution to the problem of driving the mechanical register based on the pulse signal output by the electronic AC electrical energy measuring circuit. While it would be desirable to be able to drive the mechanical register using the AC electric energy source, this typically requires the use of an expensive inverter circuit and/or expensive and bulky power supply transformers. Therefore, there remains a need in the art for an AC electric energy meter which employs the pulse signal output by an electronic AC electrical energy measuring circuit in conjunction with a conventional mechanical register to provide the desired non-volatile watthour display.

SUMMARY OF THE INVENTION

It is an object of the present invention to provide an AC electric energy meter which overcomes the deficiencies of prior art AC electric energy meters.

In particular, it is an object of the present invention to provide an AC electric energy meter which combines an electronic watt meter and a conventional mechanical register to provide the desired watthour metering function.

It is a further object of the present invention to provide an AC electric energy meter having a drive circuit which is powered by the AC electrical energy source and which is coupled to receive the pulse signal output by the electronic watt meter, wherein the drive circuit provides a mechanical drive for a conventional mechanical register.

The AC electric energy meter of the present invention is coupled to a source of AC electrical energy and to an AC electric load. The electric energy meter includes a means for sensing the amount of AC electrical energy which is consumed by the AC electric load and for generating a pulse signal representative of the amount of AC electrical energy consumed by the AC electric load. A drive circuit is coupled to the source of AC electrical energy and is also coupled to receive the pulse signal. The drive circuit includes a stepper motor coupled to the source of Ac electrical energy and having an output shaft which is rotatable. The drive circuit further includes means for controlling the flow of current from the AC electrical energy source to the stepper motor based on the pulse signal, in order to drive the stepper motor in a unidirectional manner at a rate determined by the pulse signal. The AC electric energy meter of the present invention further includes a register coupled to the output shaft of the stepper motor, for registering the amount of AC electrical energy consumed by the AC electric load based on the rotation of the output shaft of the stepper motor.

In a first embodiment of the present invention, the stepper motor comprises a core having an air gap, and a winding wound around the core. The winding has a center tap so that the winding is split into first and second portions. The stepper motor further includes a rotatable permanent magnet positioned in the air gap of the core and having the stepper motor output shaft extending therefrom. In this embodiment, the means for controlling the current flow to the stepper motor includes first and second silicon-controlled rectifiers (SCRs) respectively connected to opposite ends of the winding. First and second monostable multivibrators are respectively connected to the first and second SCRs, and the first and second monostable multivibrators are also connected to receive the pulse signal representative of the amount of AC electrical energy consumed by the AC electric load. The first and second multivibrators and the first and second SCRs cooperate to alternate the polarity of the flow of current through the winding of the stepper motor, so that the polarity of the magnetic field produced across the air gap of the core will alternate with reversals in the direction of current flow. As a result, the output shaft of the rotatable permanent magnet is caused to rotate in a single direction, thereby causing the register to register the amount of AC electric energy usage based on the rotation of the output shaft of the rotatable permanent magnet.

In a second embodiment of the present invention, the stepper motor includes a core having an air gap and a single winding wound about the core. A rotatable permanent magnet, having the output shaft extending therefrom, is positioned in the air gap. In this embodiment, the means for controlling the polarity of current flow through the winding comprises an AC switch which is coupled to one end of the winding. A pulse generating circuit provides drive pulses to the AC switch during the positive or negative polarity of the AC line voltage, thereby producing either positive or negative current through the AC switch and the winding. As a result, the polarity of the magnetic field across the air gap is alternated with changes in the direction of current flow through the winding, thereby causing the permanent magnet to rotate in a single direction. Therefore, the output shaft of the rotatable permanent magnet is rotated in a single direction to drive the register, so that the amount of AC electrical energy consumed is registered.

The AC electric energy meter of the present invention is advantageous because a simple stepper motor and simple switching circuitry are employed to drive a register based on a pulse signal from a solid state watt meter. Further, the stepper motor can be driven directly from the AC electrical energy source so as to rotate the stepper motor in a unidirectional manner to drive the register. Thus, relatively inexpensive circuitry can be used to drive the register.

These together with other objects and advantages which will become subsequently apparent, reside in the details of construction and operation as more fully hereinafter described and claimed, reference being had to the accompanying drawings, forming a part hereof, wherein like numerals refer to like parts throughout.

BRIEF DESCRIPTION OF THE DRAWINGS

FIG. 2 is a circuit diagram of the drive circuit 34 of FIG. 1 in accordance with a first embodiment of the present invention;

DETAILED DESCRIPTION OF THE PREFERRED EMBODIMENTS

Figure 1:
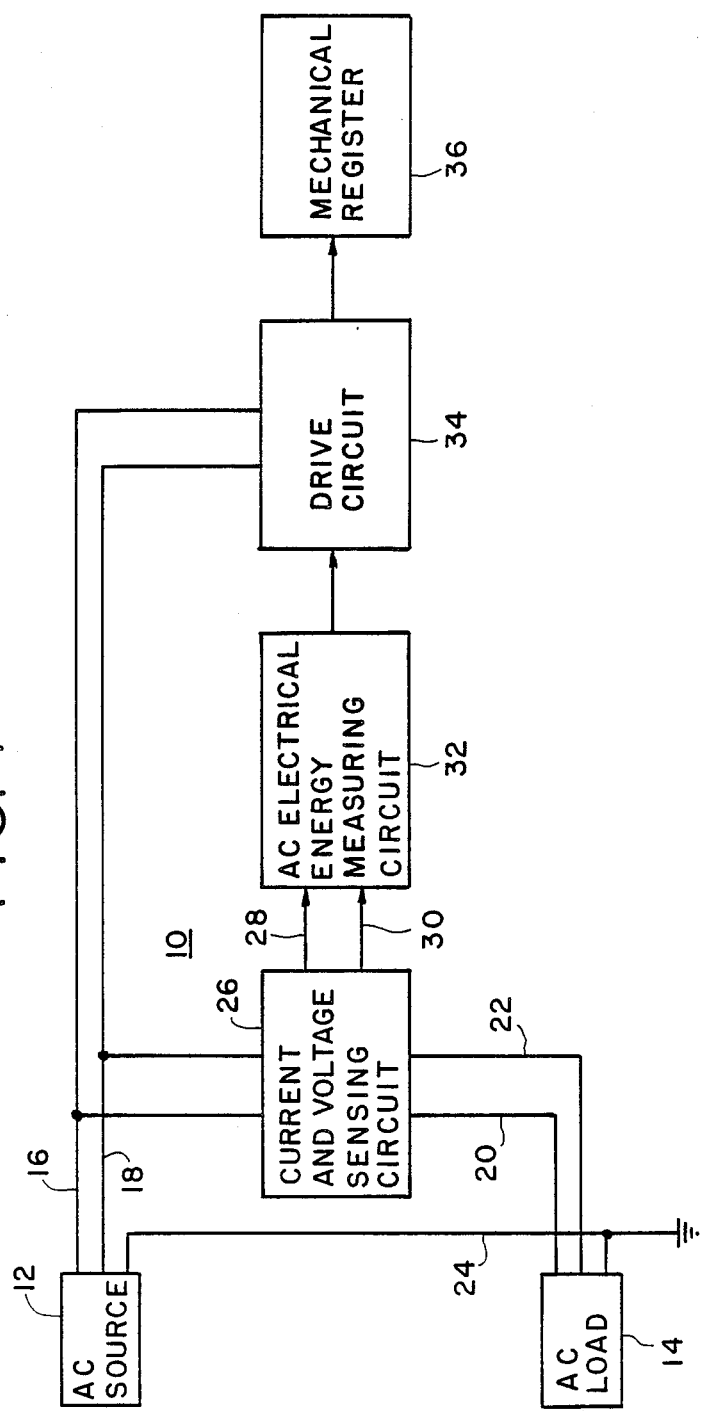
FIG. 1 is a block diagram of an embodiment of an AC electric energy meter in accordance with the present invention, and its connection to an AC electrical energy source and an AC electric load.

FIG. 1 is a block diagram of an AC electric energy meter 10 in accordance with the present invention, and its connection to an AC electrical energy source 12 and an AC electric load 14. The AC electrical energy source 12 may be any source of AC electrical energy, for example, a 60 hertz source. The meter 10 is used to measure the consumption of AC electric energy by the AC electric load 14. As is well known, the electric energy quantity to be measured in kilowatt-hours is computed from a time integral of the product of line voltage and line current components of electric energy.

Line side hot wire conductors 16 and 18 of three-wire 240/120 volts service lines, connect the AC line voltage and AC line current transmitted from the AC electrical energy source 12 (e.g., as provided by a pole top distribution transformer) to the meter 10. Load side hot wire conductors 20 and 22 connect the meter 10 to the AC electric load 14 which typically includes 120 and 240 volts electric energy consuming devices. A grounded neutral conductor 24 is typically associated with the conductors 16, 18, 20 and 22 when the conductors 16 and 18 include service conductors connected to the aforementioned distribution transformer of the AC electrical energy source 12 having a single phase three-wire 240/120 volt secondary output.

The AC electric energy meter 10 of the present invention includes a current and voltage sensing circuit 26 which acts as a means for sensing the amount of AC electrical energy which is consumed by the AC electric load 14. The current and voltage sensing circuit 26 provides a current sensing signal and a voltage sensing signal on outputs 28 and 30, respectively. The current and voltage sensing circuit 26 may be of the type described in U.S. Pat. No. 4,413,230, assigned to the assignee of the subject application, the contents of which are hereby incorporated by reference. An alternative type of current and voltage sensing circuit is disclosed in a patent application by Hemminger et al., filed on Mar. 18, 1988, which is also assigned to the assignee of the subject application and which is designated by Westinghouse Case No. 54,408, the contents of which are hereby incorporated by reference.

The current and voltage sensing signals which are output by the current and voltage sensing circuit 26 are provided to an AC electrical energy measuring circuit 32 which acts as a means for generating a pulse signal representative of the amount of AC electrical energy consumed by the AC electric load 14 based on the current and voltage sensing signals provided by the current and voltage sensing circuit 26. The AC electrical energy measuring circuit 32 may be of the type disclosed in U.S. Pat. No. 4,182,983, assigned to the assignee of the subject application, the contents of which are hereby incorporated by reference. The AC electrical energy measuring circuit 32 is essentially a watt meter which provides an output pulse signal, wherein each pulse is equivalent to a single rotation of the disk in a conventional induction type watthour meter. Since the number of kilowatt hours per pulse is known, it is a relatively simple task to convert the number of pulses over time into kilowatt hours. Together, the current and voltage sensing circuit 26 and the AC electrical energy measuring circuit 32 form a means for sensing the amount of AC electrical energy consumed by the AC electric load 14 and for providing a pulse signal representative of the amount of AC electrical energy consumed by the AC electric load 14.

A drive circuit 34 receives the pulse signal output by the AC electrical energy measuring circuit 32 and is also connected to the AC electrical energy source 12, via the line side hot wire conductors 16 and 18. The drive circuit 34 produces a mechanical output for driving a mechanical register 36, so that the mechanical register 36 registers the amount of AC electrical energy consumed by the AC electric load 14 and provides a corresponding display. In the preferred embodiment, the mechanical register 36 is of the type disclosed in U.S. Pat. No. 4,531,051, assigned to the assignee of the subject application, the contents of which are hereby incorporated by reference.

FIG. 2 is a circuit diagram of the drive circuit 34 of FIG. 1 in accordance with a first embodiment of the present invention. Referring to FIG. 2, the drive circuit 34 includes a stepper motor 38 and a switching circuit 40 which acts as a means for controlling the current flow from the AC electrical energy source 14 to the stepper motor 38 to drive the stepper motor 38 in a unidirectional manner.

The stepper motor 38 is coupled to line side hot wire conductor 16 via a resistor 42 which reduces the current applied to the stepper motor 38. The resistor 42 and a shunt capacitor 44 provide electrical transient protection for the drive circuit 34. The stepper motor 38 includes a core 46 having an air gap 48, and having a coil or winding 50 wound around the core 46. The core 46 is formed by, for example, M45 steel, and the winding 50 may be formed by approximately 2200 turns of No. 38 enamel wire. The winding 50 has a center tap 52 which is connected to the resistor 42, and which divides the winding 50 into portions 50a and 50b. A permanent magnet 54 which, in the preferred embodiment is circular, is positioned in the air gap 48, and is rotatable about an axis 56. The permanent magnet 54 has diametrically opposed poles 55 and 57. Projections 58 are provided on the core 46 to bias the permanent magnet 54 so that the axis of the poles 55 and 57 of the permanent magnet (i.e., the diameter connecting poles 55 and 57) is offset from the axis of poles 68 and 70 of the electromagnet formed by core 46 and winding 50 when a current is flowing through the winding 50. Alternatively, two diagonally opposed corner portions of the ends of the core 46 adjacent the air gap 48 may be removed or notched to provide the same biasing effect.

The stepper motor 38 is a modified version of a conventional clock motor of the type used in small battery powered quartz analog clocks, wherein core 46 and winding 50 form the stator, and the permanent magnet 54 forms the rotor of the motor. As indicated above, the stator magnetic circuit is designed such that when no magnetic field is generated across the air gap 48, the rotor (i.e., permanent magnet 54) rests at an angular position between the direct and quadrature positions produced by the stator (i.e., core 46 and winding 50) acting alone. In this way, the rotor rotates in a predictable angular direction from one stable magnetic position to another upon application of a given polarity stator winding current. By reversing the stator voltage sequentially it is possible to cause the rotor (i.e., the permanent magnet 54) to rotate in a single direction. The conventional way to reverse the stator voltage between pulses is to use a full or half-bridge inverter circuit. While this is practical when the motor is driven from a low voltage source such as a battery, it is not practical if the motor is powered by the AC electrical energy source 12 unless an expensive and bulky power supply transformer and/or an expensive inverter circuit are inserted between the motor and the AC electrical energy source 12. The switching circuit 40 which is employed in the present invention overcomes the necessity for using such bulky and/or expensive circuitry.

The switching circuit 40 includes a pair of pulse generating circuits formed by monostable multivibrators 60 and 62, and a pair of unidirectional switches formed by silicon controlled rectifiers (SCRs) 64 and 66. The monostable multivibrators 60 and 62 are both coupled to receive the output of the AC electrical energy measuring circuit 32, which is a pulse signal. One of the monostable multivibrators 60 and 62 is triggered by the positive edges of pulses in the pulse signal provided by the AC electrical energy measuring circuit 32, while the other of the monostable multivibrators 60 and 62 is triggered by the negative edges of the pulses in the pulse signal from the AC electrical energy measuring circuit 32. In the preferred embodiment, the monostable multivibrators 60 and 62 provide 100 msec. pulses. The output pulse of the monostable multivibrator 60 is provided to the gate of the SCR 64, while the output pulse of the monostable multivibrator 62 is provided to the gate of the SCR 66. Therefore, 100 msec. pulses will alternately be provided to the gates of SCRs 64 and 66 to turn on SCRs 64 and 66 alternately. When SCR 64 is turned on, current flows into the center tap 52 and through portion 50a of coil 50 to generate a magnetic field of a first polarity across the air gap 48. When the gate pulse provided to the gate of the SCR 64 ends, then the SCR 64 will be turned off the next time the polarity of the AC line voltage on conductor 16 reverses.

As explained above, when a current flows through the winding 50, magnetic poles 68 and 70 are produced in the core 46. For the rotor position illustrated in FIG. 2, the permanent magnet 54 is arranged so that when a current flows through portion 50a of the winding 50, pole 68 and pole 55 will be of the same polarity. As a result, pole 55 of the permanent magnet 54 will be repelled by pole 68, causing the permanent magnet 54 to rotate about axis 56 in the direction of arrow A in FIG. 2. As the permanent magnet 54 rotates, pole 55 of the permanent magnet 54 becomes attracted to opposite polarity pole 70, and the permanent magnet 54 will eventually come to rest in a position such that poles 55 and 57 are in positions which are reversed from those illustrated in FIG. 2 (i.e., after one-half revolution of the permanent magnet 54). As explained above, when the SCR 64 is turned off, no current flows through the winding 50 and the magnetic field produced by the electromagnet formed by core 46 and winding 50 falls to zero. However, the position of the permanent magnet 54 is maintained by the projections 58.

When the pulse output of the monostable multivibrator 62 turns on SCR 66, a current flows through the center tap 52 and through portion 50b of the winding 50. As a result of this current flow, a magnetic field having a second polarity is generated across the air gap 48. The second polarity is opposite to the first polarity which was generated when current flowed through portion 50a of the winding 50. In this case, the polarity of pole 70 and pole 55 of the permanent magnet 54 will be the same, so that pole 55 of permanent magnet 54 will be repelled by pole 70, hereby causing the permanent magnet 54 to rotate about axis 56 in the direction of arrow A until pole 55 returns to the position illustrated in FIG. 2. Thus, current flow through portion 50b of winding 50 causes an additional one-half revolution of the permanent magnet 54.

Figure 4:
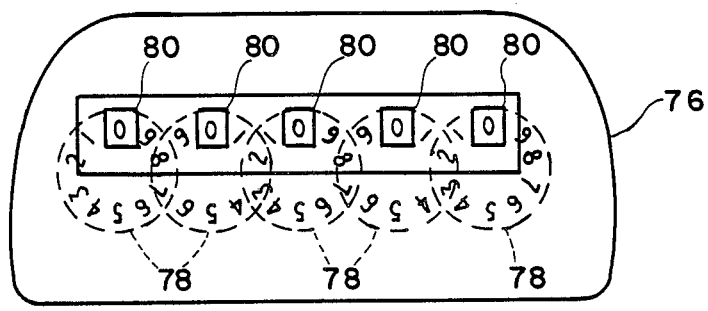
FIG. 4 is a front view of the face plate of a conventional electric meter register.
Figure 3:
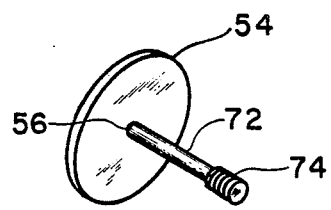
FIG. 3 is a perspective view of the permanent magnet 54 of FIG. 2 and the output shaft which is used to drive the mechanical register 36 of FIG. 1.

The above-described process of rotating the permanent magnet 54 through two half revolutions for each pulse from AC electrical energy measuring circuit 32 is continued, to alternately supply current to portions 50a and 50b of winding 50, thereby generating magnetic fields across the air gap 48 which are of alternating polarity. As a result, the permanent magnet 54 is always caused to rotate in the direction of arrow A in FIG. 2, thereby providing a rotational output which is used to drive the mechanical register 36. In particular, as illustrated in FIG. 3, permanent magnet 54 has a shaft 72 extending therefrom along the axis 56, which acts as an output shaft of the stepper motor 38. A gear 74 is coupled to the shaft 72 and is rotated with the shaft 72 to drive the mechanical register 36. The mechanical register 36 may include a face plate 76 (FIG. 4) through which indicia is visible. A plurality of wheels 78 are rotated in conjunction with a Geneva-type register movement in dependence upon the rotation of the permanent magnet 54 in known fashion, and a numerical display corresponding to the amount of AC electrical energy consumed, is provided through windows 80. The wheels 78 are rotated to present different numerical indications via gearing coupled to gear 74 on shaft 72 in known fashion. Since a single pulse from the AC electrical energy measuring circuit 32 corresponds to one revolution of the disk in an induction type watthour meter, and since one revolution of permanent magnet 54 corresponds to one pulse from the AC electrical energy measuring circuit 32, one revolution of the permanent magnet 54 is equivalent to one revolution of the disk in an induction type watthour meter. Therefore, it is a simple task to use the mechanical output of stepper motor 38 to drive the mechanical register 36.

Figure 5:
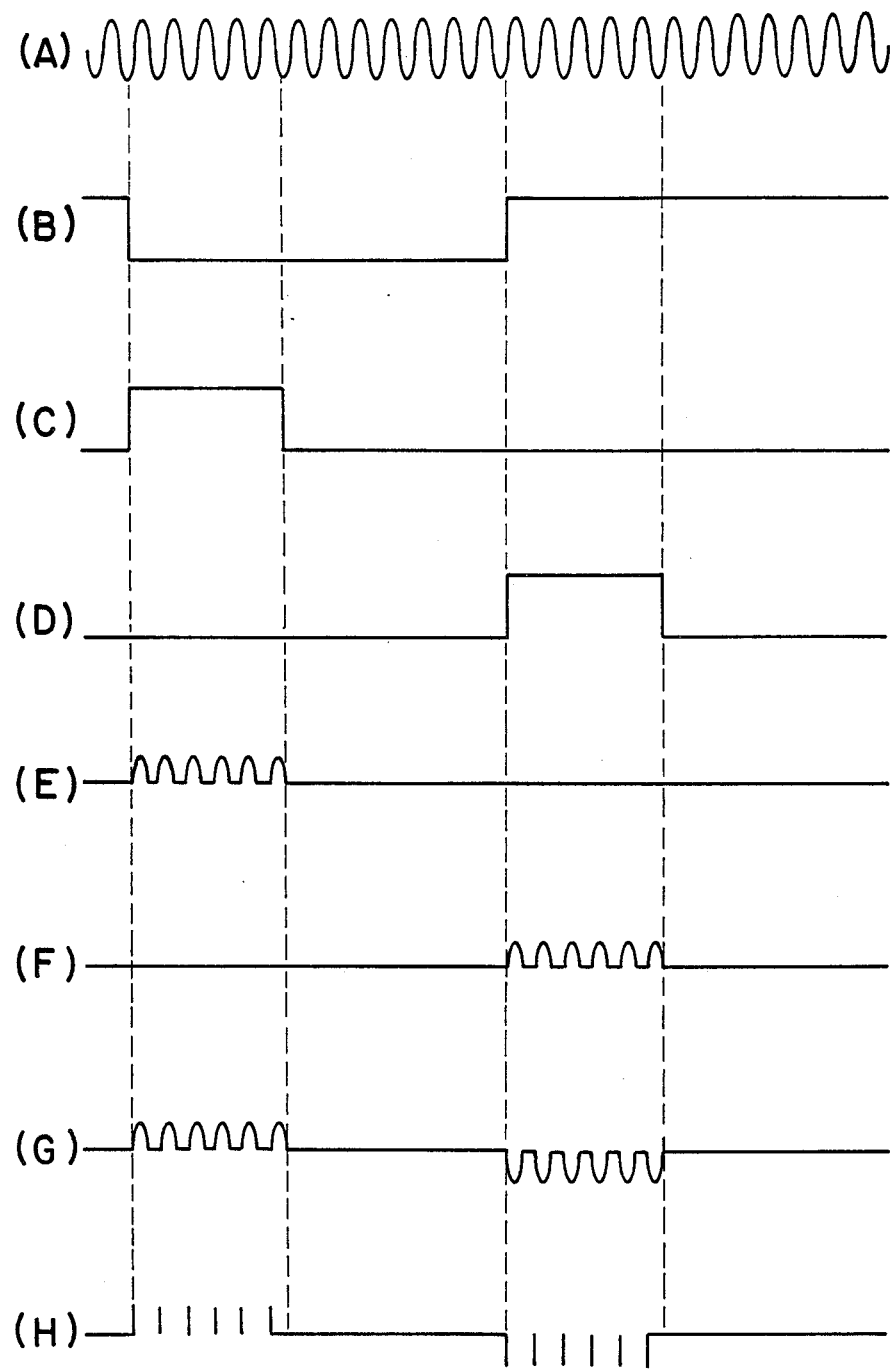
FIG. 5 shows waveform diagrams for illustrating the waveforms present in FIGS. 1, 2 and 6.

The waveforms over time of the signals present in the circuit of FIG. 2 are illustrated in FIGS. 5A–5F of the drawings. FIG. 5A illustrates the waveform for the amplitude of the AC line voltage over time. FIG. 5B illustrates the pulse signal over time which is output by the AC electrical energy measuring circuit 32. FIG. 5C illustrates the output pulse of the monostable multivibrator 60 which provides a 100 msec. pulse triggered by the negative edge of the pulse in the pulse signal of FIG. 5B. As described above, when the pulse output of FIG. 5C is generated, the SCR 64 is turned on, at which time a pulsed current corresponding to the positive polarity portions of the AC line voltage, is provided through portion 50a of winding 50 as illustrated in FIG. 5E. Since the pulse output by the monostable multivibrator 60 is approximately 100 msec. long and the AC line voltage has a period of approximately 16.66 msec., approximately 6 current pulses are provided to portion 50a of the winding 50 to cause a magnetic field across the air gap 48 and resultant rotation of the permanent magnet 54 by one-half revolution. FIG. 5D illustrates the waveform output by the monostable multivibrator 62 which is triggered by the positive edge of the pulse illustrated in FIG. 5B. The pulse output by the monostable multivibrator 62 turns on the SCR 66 which in turn causes the AC current to flow through portion 50b of winding 50, as illustrated by the waveform of FIG. 5F. Since the current flow through winding 50 is in the opposite direction when the current flows through portion 50b of winding 50, a magnetic field of opposite polarity is generated across the air gap 48, thereby causing the permanent magnet 54 to rotate by one-half revolution. Therefore, each pulse in the pulse signal output by the AC electrical energy measuring circuit 32 causes one revolution of the permanent magnet 54 which corresponds to a single revolution of the rotating disk in prior art induction type watthour meters.

Figure 6:
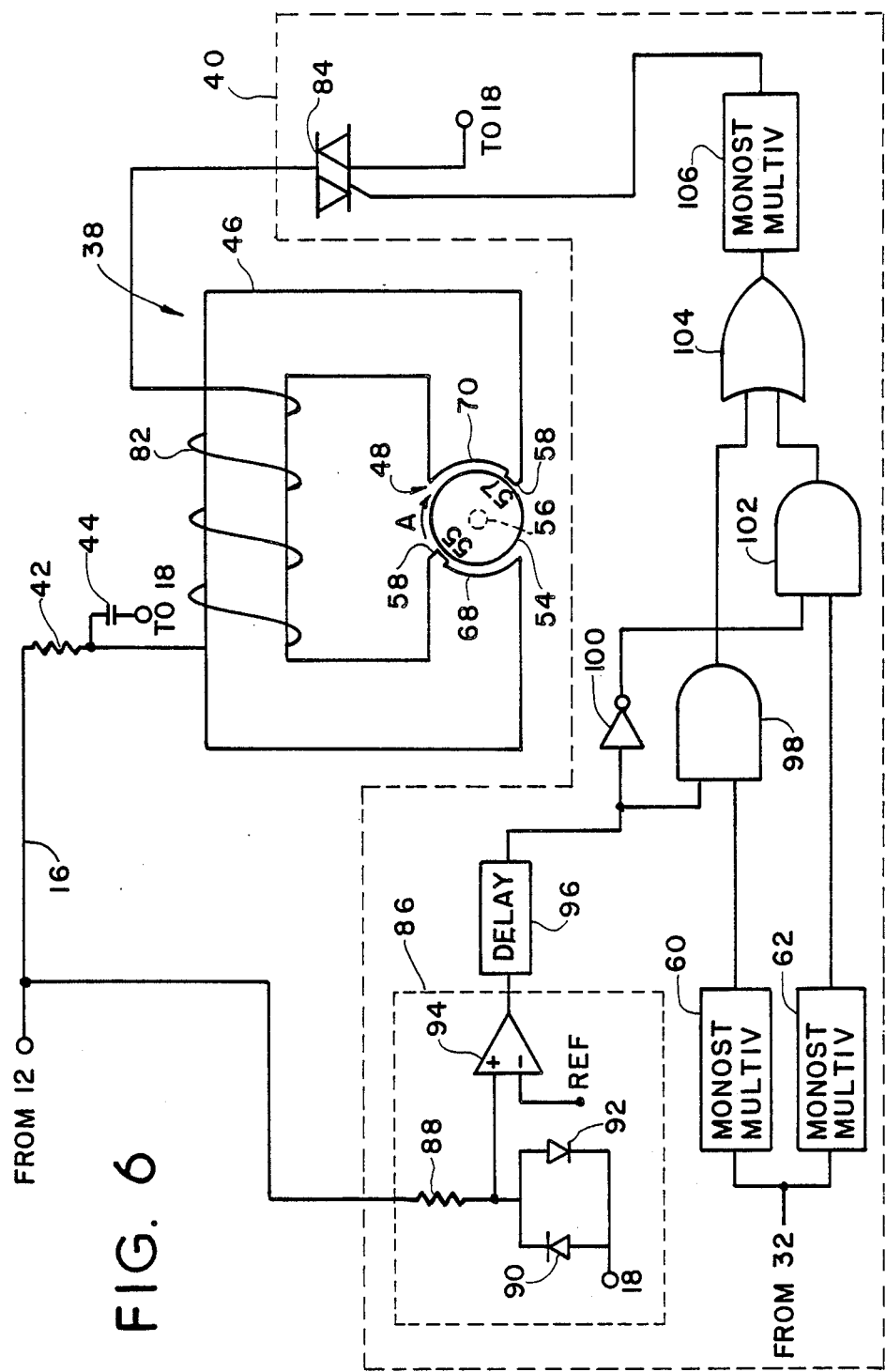
FIG. 6 is a circuit diagram of the drive circuit 34 of FIG. 1 in accordance with a second embodiment of the present invention.

FIG. 6 is a circuit diagram of the drive circuit 34 of FIG. 1 in accordance with a second embodiment of the present invention. Those portions of the circuitry of FIG. 6 which are the same as FIG. 2 are labelled with the same reference numerals and will not be discussed in detail again. The remaining portions of FIG. 6 are discussed below. In the embodiment of FIG. 6, a winding 82 is connected to the conductor 16 via resistor 42. Thus, in the embodiment of FIG. 6, there is no center tap corresponding to center tap 52 provided in FIG. 2. In addition, in the embodiment of FIG. 6, the switching circuit 40 includes a bidirectional switch which is an AC switch or triac 84, in place of the SCRs 64 and 66 of FIG. 2. The AC switch 84 operates in a manner similar to SCRs 64 and 66 but has the added feature that it can conduct anode current of both polarities. Current flow is initiated by a small turn-on gate current pulse and is stopped by the natural anode current commutation produced by a line voltage reversal. Due to the bidirectional nature of the AC switch 84, it is necessary to provide a synchronizing circuit 86 in the switching circuit 40. The gate pulses for the AC switch 84 are synchronized to the AC line voltage, thereby making it possible to produce a series of anode current pulses of a given polarity for each output pulse of the AC electrical energy measuring circuit 32. The polarity of the anode current pulses can be reversed to provide the desired unidirectional rotation of the permanent magnet 54. If desired, the number and/or degree of conduction of each of the unidirectional anode current pulses can be controlled to accommodate certain changing operations, such as variations in line voltage.

The synchronizing circuit 86 includes a resistor 88, diodes 90 and 92 and a comparator 94 for determining the polarity of the AC line voltage. The comparator 94 outputs a synchronizing signal which is used to control the polarity of the current which flows through the winding 82. An optional delay circuit 96 may be employed for phase control purposes by offsetting the application of the current pulses which are provided on the winding 82. The synchronizing signal and the output of the monostable multivibrator 60 are input to an AND gate 98. The synchronizing signal is also provided to an inverter 100, and the inverted synchronizing signal and the output of the monostable multivibrator 62 are input to an AND gate 102. The outputs of the AND gates 98 and 102 are input to an OR gate 104, and the output of the OR gate is used to trigger a monostable multivibrator 106 having a very small pulse width. In the preferred embodiment, the pulse width output by the monostable multivibrator 106 is approximately 0.1 msec. The output of the monostable multivibrator 106 is applied to the gate of the AC switch 84 to control the direction of current flow through the winding 82. FIG. 5H illustrates the positive and negative pulse trains which are output by the monostable multivibrator 106 during the ON time of the mono-stable multivibrators 60 and 62, respectively. These pulses trigger the AC switch 84 to cause it to be conductive for the appropriate polarity of the AC line signal, so that the series of 0.1 msec. pulses output by the monostable multivibrator 106 during the 100 msec. pulse output by the monostable multivibrator 60 causes a series of 8.33 msec. positive polarity current pulses to be applied to the winding 82. As a result, a magnetic field is generated across the air gap 48, which causes permanent magnet 54 to rotate by one-half revolution in the direction of arrow A in FIG. 6. Similarly, the 0.1 msec. negative pulses output by the monostable multivibrator 106 during the ON time of the 100 msec. pulse generated by the monostable multivibrator 62 cause a series of 8.33 msec. negative polarity current pulses to be applied to the winding 82. As a result, a magnetic field of opposite polarity is generated across the air gap 48, thereby causing the permanent magnet 54 to rotate by one-half revolution in the direction of arrow A in FIG. 6. As with the circuit of FIG. 2, this process is continued so that the direction of current flow through the winding 82 is alternated to produce rotation of the permanent magnet 54 in a single direction.

The operation of the AC electric energy meter of the present invention is as follows. The current and voltage sensing circuit 26 senses the amount of AC electrical energy which is consumed by the AC electric load 14 and generates a current sensing signal and a voltage sensing signal which are applied to the AC electrical energy measuring circuit 32. The AC electrical energy measuring circuit 32 produces a pulse signal representative of the amount of AC electrical energy consumed by the AC electric load 14. This pulse signal is provided to the switching circuit 40 of the drive circuit 34, and the AC line voltage is applied to the stepper motor 38. Magnetic fields of alternating polarity are generated across the air gap 48 of the core 46 in dependence upon the pulse signal, thereby causing the permanent magnet 54 to rotate about its axis 56 in the direction of arrow A (FIGS. 2 and 6). The polarity of the magnetic field which is generated is determined by the operation of the switching circuit 40 in accordance with the pulse signal output by the AC electrical energy measuring circuit 32. As the permanent magnet 54 is rotated, a mechanical output is provided to the mechanical register 36 to cause the register 36 to register and display the amount of AC electrical energy consumed by the AC electric load 14.

The AC electric energy meter of the present invention provides significant advantages in that it is capable of directly driving the mechanical register 36 from power supplied by the AC electrical energy source 12. Further, the present invention does not require a transformer or an inverter circuit in order to sequentially reverse the stator voltage of the stepper motor 38.

The electric energy meter of the present invention may be implemented in numerous ways. For example, the present invention is applicable to measurement of AC electric energy quantities such as kilowatt hours, volt-ampere hours, and reactive volt-ampere hours. Thus, the meter 10 of the present invention is applicable to real and reactive meters. While the invention has been described as employing SCR's (FIG. 2) and an AC switch (FIG. 6) any type of unidirectional switching element (FIG. 2) or bidirectional switching element (FIG. 6) may be employed. Further, any available voltage and current sensing circuitry can be employed. If desired, the meter 10 can be phase-controlled by sensing the AC line voltage (in a manner similar to the sensing provided by the synchronizing circuit 86 in FIG. 6) and a fixed number of current pulses can be provided with a variable phase or a variable number of pulses can be provided with a fixed phase. For example, in the description of the preferred embodiment, it is explained that there are approximately six 8.33 msec. pulses provided during one-half revolution of the permanent magnet 54, but this number may be varied as desired. In addition, phase control can be provided by delaying the drive pulse by a predetermined time after the line voltage changes polarity. The present invention is also applicable to single and multiple phase meters and can be used with a variety of types of mechanical registers.

In the present invention, it is also possible to provide braking to slow the rotation of the permanent magnet 54. Over time, it is possible that over-rotation of the permanent magnet 54 could occur in a situation where a short but strong current pulse is provided on the winding 50 or 82. This could result in a situation where the permanent magnet 54 would rotate past its half revolution point and have sufficient momentum that it would continue rotating to complete a full revolution. This would be caused by the fact that while a high current pulse is provided through the winding, the current pulse is very short, so that a repelling braking force which is usually provided by the electromagnet formed by the winding 50 (or 82) and the core 46, is not present. By providing the 100 msec. time period explained above with respect to the embodiments of the present invention, a braking effect is provided because the permanent magnet 54 will be repelled as it begins to rotate past the half revolution point towards the electromagnetic pole having the same polarity. However, such braking could also be provided by reversing the direction of current flow through the coil during a single half revolution of the permanent magnet 54; that is, during a single 100 msec. (or less) time period.

The many features and advantages of the invention are apparent from the detailed specification and thus it is intended by the appended claims to cover all such features and advantages of the system which fall within the true spirit and scope of the invention. Further, since numerous modifications and changes will readily occur to those skilled in the art, it is not desired to limit the invention to the exact construction and operation shown and described and, accordingly, all suitable modifications and equivalents may be resorted to, falling within the scope of the invention.

What is claimed is:

1. An AC electric energy meter coupled to a source of AC electrical energy and an AC electric load, comprising:

first means for sensing the amount of AC electrical energy consumed by the AC electric load and for generating a pulse signal representative of the amount of Ac electrical energy consumed by the AC electric load;

a drive circuit coupled to the source of AC electrical energy and to said first means, said drive circuit including:

a two-pole single phase stepper motor coupled to the source of AC electrical energy and having an output shaft which is rotatable; and second means for controlling a flow of current from the AC electrical energy source through said stepper motor, so that the output shaft of said stepper motor is rotated in a unidirectional manner based on the pulse signal generated by said first means; and a register, coupled to the output shaft of said stepper motor, for registering the amount of AC electrical energy consumed by the AC electric load based on the rotation of the output shaft of said stepper motor.

2. An AC electric energy meter as set forth in claim 1, wherein said stepper motor comprises a winding coupled to the source of AC electrical energy and wherein said second means comprises a switching circuit, coupled to said winding, for controlling the direction of the flow of current through said winding, so that the output shaft of said stepper motor is rotated in a unidirectional manner.

3. An AC electric energy meter as set forth in claim 2, wherein said winding has first and second ends and wherein said switching circuit comprises:

a first unidirectional switching element, coupled to the first end of said winding and to said first means, for allowing current of a first polarity to flow through said winding; and a second unidirectional switching element coupled to the second end of said winding and to said first means, for allowing current of a second polarity which is opposite to the first polarity, to flow through said winding.

4. An AC electric energy meter as set forth in claim 3, wherein said first and second unidirectional switching elements comprise first and second silicon controlled rectifiers, respectively.

5. An AC electric energy meter as set forth in claim 2, wherein said switching circuit comprises a bidirectional switching element for controlling the polarity of the flow of current through said winding, so that current of alternating first and second polarities flows through said winding.

6. An AC electric energy meter as set forth in claim 5, wherein said bidirectional switching element comprises an AC switch.

7. An AC electric energy meter as set forth in claim 1, wherein said stepper motor comprises:
 a core having a nonuniform air gap;
 a rotatable permanent magnet positioned in the nonuniform air gap of said core; and
 a winding wound about said core and coupled to said second means, wherein a magnetic field is generated across the nonuniform air gap based upon the flow of current through said winding.

8. An AC electric energy meter as set forth in claim 7, wherein said winding has first and second ends, wherein said winding is coupled to the source of AC electrical energy via a center tap which divides said winding into first and second portions, and wherein said second means comprises a switching circuit including:
 a first switching element coupled to the first end of said winding and coupled to said first means; and
 a second switching element, coupled to the second end of said winding and to said first means, wherein said first and second switching elements are alternately conductive based upon the pulse signal so as to cause current to alternately flow through said first and second portions of said winding, thereby generating magnetic fields of alternating polarity across the nonwoven air gap to rotate said rotatable permanent magnet in a unidirectional manner.

9. An AC electric energy meter as set forth in claim 8, wherein each of the pulses in the pulse signal generated by said first means has a first edge and a second edge and wherein said switching circuit further comprises:
 a first pulse generator circuit, coupled to said first means and said first switching element, for providing a first switching pulse output in response to the first edge of each pulse in the pulse signal, so as to turn on said first switching element to cause current to flow through said first portion of said winding; and
 a second pulse generating circuit, coupled to said first means and said second switching element, for providing a second switching pulse output in response to the second edge of each pulse in the pulse signal, so as to turn on said second switching element, thereby causing a current to flow through said second portion of said winding.

10. An AC electric energy meter as set forth in claim 9, wherein said first and second switching elements comprise first and second silicon controlled rectifiers, respectively, and wherein said first and second pulse generating circuits comprise first and second monostable multivibrators, respectively.

11. An AC electric energy meter as set forth in claim 1, wherein said stepper motor comprises:
 a core having a nonwoven air gap;
 a rotatable permanent magnet positioned in the nonuniform air gap of said core, said rotatable permanent magnet having the output shaft of said stepper motor extending therefrom; and
 a winding wound about said core and having a first end coupled to the source of AC electrical energy and having a second end coupled to said second means.

12. An AC electric energy meter as set forth in claim 11, wherein the source of AC electrical energy provides an AC line voltage having first and second polarities, and wherein said second means comprises a switching circuit including:
 a pulse generating circuit, coupled to the source of AC electrical energy and coupled to said first means, for providing first and second gate pulse trains during the first and second polarities of the AC line voltage; and
 a switching element coupled to said pulse generating circuit and to the second end of said winding, for controlling the flow of current from the AC electrical energy source to said winding by alternating the polarity of the current flowing through said winding based on the first and second gate pulse trains, to cause the magnetic field across the nonuniform air gap of said core to alternate polarities, thereby causing said rotatable permanent magnet to rotate in a unidirectional manner.

13. An AC electric energy meter as set forth in claim 12, wherein said switching element comprises an AC switch and wherein said pulse generating circuit comprises:
 a synchronizing circuit, coupled to the source of AC electrical energy, for providing first and second synchronizing signals of opposite polarity; and
 means for receiving the pulse signal from said first means and the first and second synchronizing signals, and for generating the first and second gate pulse trains which are of alternating polarity synchronized with the polarity of the AC line voltage of the source of AC electrical energy.

14. An AC electric energy meter as set forth in claim 1, wherein said first means comprises:
 a sensing circuit, coupled to the source of AC electrical energy and the AC electric load, for sensing the amount of AC electrical energy which is consumed by the AC electric load and for generating a current sensing signal and a voltage sensing signal; and
 an AC electrical energy measuring circuit, coupled to said sensing circuit and said second means, for receiving the current and voltage sensing signals and for generating the pulse signal representative of the amount of AC electrical energy consumed by the AC electric load.

15. An AC electric energy meter as set forth in claim 14, wherein said stepper motor comprises:
 a core having a nonuniform air gap;
 a rotatable permanent magnet positioned in the nonuniform air gap of said core; and means for generating a magnetic field across the nonuniform air gap based upon the flow of current to said stepper motor.

16. An AC electric energy meter as set forth in claim 14, wherein said stepper motor further comprises means for biasing said rotatable permanent magnet so that the axis along the poles of the permanent magnet is at an angle with respect to the axis of the magnetic field which is generated across the air gap.

17. An AC electric energy meter coupled to a source of AC electrical energy and an AC electric load, comprising:

sensing and generating means for sensing the amount of AC electrical energy consumed by the AC electric load and for generating a pulse signal representative of the amount of AC electrical energy consumed by the AC electric load;

a core having a nonuniform air gap;

a two-pole rotatable permanent magnet positioned in the nonuniform air gap of said core, said rotatable permanent magnet having an output shaft;

a winding wound about said core and coupled to the source of AC electrical energy;

a switching circuit, coupled to said winding and said sensing and generating means, for controlling a flow of current from the AC electrical energy source to said winding, so that the output shaft of said rotatable permanent magnet is rotated in a unidirectional manner based on the pulse signal generated by said sensing and generating means; and a register, coupled to the output shaft of said rotatable permanent magnet, for registering the amount of AC electrical energy consumed by the AC electric load based on the rotation of the output shaft of said rotatable permanent magnet.

18. An AC electric energy meter as set forth in claim 17, wherein said winding has first and second ends, wherein said winding is coupled to the source of AC electrical energy via a center tap which divides said winding into first and second portions, and wherein said switching circuit includes:

a first unidirectional switching element coupled to the first end of said winding and coupled to said sensing and generating means; and a second unidirectional switching element, coupled to the second end of said winding and to said sensing and generating means, wherein said first and second unidirectional switching elements are alternately conductive based upon the pulse signal so as to cause current to alternately flow through the first and second portions of said winding, thereby generating magnetic fields of alternating polarity across the nonuniform air gap to rotate said rotatable permanent magnet in a unidirectional manner.

19. An AC electric energy meter as set forth in claim 17, wherein the source of AC electrical energy provides an AC line voltage having first and second polarities, wherein said winding has a first end coupled to the source of AC electrical energy and a second end coupled to said switching circuit, and wherein said switching circuit includes:

a pulse generating circuit coupled to the source of AC electrical energy and coupled to said sensing and generating means, for providing first and second gate pulse trains during the first and second polarities of the AC line voltage; and a bidirectional switching element coupled to said pulse generating circuit and to the second end of said winding, for controlling the flow of current from the AC electrical energy source through said winding by alternating the polarity of the current flowing through the winding based on the first and second gate pulse trains, to cause the magnetic field across the nonuniform air gap of said core to alternate polarities, thereby causing said rotatable permanent magnet to rotate in a unidirectional manner.

20. Apparatus for driving a register of an AC electric meter based on a pulse signal representative of an amount of AC electrical energy consumed by an AC electric load, said apparatus being coupled to an AC electrical energy source and comprising:

a two-pole single phase stepper motor coupled to the source of AC electrical energy and having a rotatable output shaft; and means for controlling the current flow from the AC electrical energy source through said stepper motor to rotate the output shaft of said stepper motor in a unidirectional manner based on the pulse signal representative of the amount of AC electrical energy consumed by the AC electric load, the rotation of the output shaft of said stepper motor causing the output shaft of said stepper motor to increment the register.

21. An apparatus for driving a register of an AC electric meter as set forth in claim 20, wherein said stepper motor comprises:

a core having a nonuniform air gap;

a rotatable permanent magnet positioned in the nonuniform air gap of said core, said rotatable permanent magnet having the output shaft of said stepper motor extending therefrom; and a winding wound about said core and coupled to said means for controlling current flow, wherein a magnetic field is generated across the nonuniform air gap based upon the flow of current through said winding.

22. Apparatus for driving the register of an AC electric meter as set forth in claim 21, wherein said winding has first and second ends, wherein said winding is coupled to the source of AC electric energy via a center tap which divides said winding into first and second portions, and wherein said means for controlling current flow comprises a switching circuit including:

a first switching element coupled to the first end of said winding and coupled to receive the pulse signal; and a second switching element, coupled to the second end of said winding and coupled to receive the pulse signal, wherein said first and second switching elements are alternately conductive based upon the pulse signal so as to cause current to alternately flow through said first and second portions of said winding, thereby generating magnetic fields of alternating polarity across the nonuniform air gap to rotate said rotatable permanent magnet in a unidirectional manner.

23. Apparatus for driving a register of an AC electric meter as set forth in claim 20, wherein said stepper motor comprises:

a core having a nonuniform air gap;

a rotatable permanent magnet positioned in the nonuniform air gap of said core, said rotatable permanent magnet having the output shaft of said stepper motor extending therefrom; and a winding wound about said core and having a first end coupled to the source of AC electrical energy and having a second end coupled to said means for controlling current flow.

24. Apparatus for driving a register of an AC electric meter as set forth in claim 23, wherein the source of AC electrical energy provides an AC line voltage having first and second polarities, and wherein said means for controlling current flow comprises:

a pulse generating circuit, coupled to the source of AC electrical energy and coupled to receive the pulse signal, for providing first and second gate pulse trains during the first and second polarities of the AC line voltage; and a switching element, coupled to said pulse generating circuit and to the second end of said winding, for controlling the flow of current from the AC electrical energy source to said winding by alternating the polarity of the current flowing through said winding based on the first and second gate pulse trains, to cause the magnetic field across the nonuniform air gap of said core to alternate polarities, thereby causing said rotatable permanent magnet to rotate in a unidirectional manner.

25. An AC electric energy meter coupled to a source of AC electrical energy and an AC electric load, comprising:

first means for sensing the amount of AC electrical energy consumed by the AC electric load and for generating a pulse signal representative of the amount of AC electrical energy consumed by the AC electric load;

a drive circuit coupled to the source of AC electrical energy and to said first means, said drive circuit including:

a stepper motor coupled to the source of AC electrical energy and having an output shaft which is rotatable, said stepper motor comprising a winding coupled to the source of AC electrical energy and having first and second ends; and second means for controlling a flow of current from the AC electrical energy source through said stepper motor, said second means comprising a switching circuit, coupled to said winding, for controlling the direction of the flow of current through said winding so that the output shaft of said stepper motor is rotated in a unidirectional manner based on the pulse signal generated by said first means, said switching circuit comprising:

a first unidirectional switching element, coupled to the first end of said winding and to said first means, for allowing current of a first polarity to flow through said winding; and a second unidirectional switching element, coupled to the second end of said winding and to said first means, for allowing current of a second polarity which is opposite to the first polarity, to flow through said winding; and a register, coupled to the output shaft of said stepper motor, for registering the amount of AC electrical energy consumed by the AC electric load based on the rotation of the output shaft of said stepper motor.

26. An AC electric energy meter coupled to a source of AC electrical energy and an AC electric load, comprising:

first means for sensing the amount of AC electrical energy consumed by the AC electric load and for generating a pulse signal representative of the amount of AC electrical energy consumed by the AC electric load;

a drive circuit coupled to the source of AC electrical energy and to said first means, said drive circuit including:

a stepper motor coupled to the source of AC electrical energy and having an output shaft which is rotatable, said stepper motor comprising a winding coupled to the source of AC electrical energy and having first and second ends; and second means for controlling a flow of current from the AC electrical energy source through said stepper motor, said second means comprising a switching circuit, coupled to said winding, for controlling the direction of the flow of current through said winding so that the output shaft of said stepper motor is rotated in a unidirectional manner based on the pulse signal generated by said first means, said switching circuit comprising a bidirectional switching element for controlling the polarity of the flow of current through said winding, so that current of alternating first and second polarities flows through said winding; and a register, coupled to the output shaft of said stepper motor, for registering the amount of AC electrical energy consumed by the AC electric load based on the rotation of the output shaft of said stepper motor.

27. An AC electric energy meter coupled to a source of AC electrical energy and an AC electric load, comprising:

first means for sensing the amount of AC electrical energy consumed by the AC electric load and for generating a pulse signal representative of the amount of AC electrical energy consumed by the AC electric load;

a drive circuit coupled to the source of AC electrical energy and to said first means, said drive circuit including:

a stepper motor coupled to the source of AC electrical energy and having an output shaft which is rotatable, said stepper motor comprising:

a core having an air gap;

a rotatable permanent magnet positioned in the air gap of said core, said rotatable permanent magnet having the output shaft of said stepper motor extending therefrom; and a winding wound about said core and having a first end coupled to the source of AC electrical energy and having a second end; and second means, coupled to the second end of said winding, for controlling a flow of current from the AC electrical energy source through said stepper motor, the source of AC electrical energy providing an AC line voltage having first and second polarities, said second means comprising a switching circuit including:

a pulse generating circuit, coupled to the source of AC electrical energy and coupled to said first means, for providing first and second gate pulse trains during the first and second polarities of the AC line voltage; and a switching element, coupled to said pulse generating circuit and to the second end of said winding, for controlling the flow of current from the AC electrical energy source to said winding by alternating the polarity of the current flowing through said winding based on the first and second gate pulse trains, to cause the magnetic field across the air gap of said core to alternate polarities, thereby causing said rotatable permanent magnet to rotate in a unidirectional manner based on the pulse signal generated by said first means; and a register, coupled to the output shaft of said stepper motor, for registering the amount of AC electrical energy consumed by the AC electric load based on the rotation of the output shaft of said stepper motor.

* * * * *